(12) United States Patent
Edwards et al.

(10) Patent No.: US 6,329,878 B1
(45) Date of Patent: Dec. 11, 2001

(54) METHOD AND APPARATUS FOR IMPROVING POWER SUPPLY REJECTION IN AMPLIFIER RAIL TO RAIL OUTPUT STAGES

(75) Inventors: Christopher F. Edwards, Sunnyvale; J. Williams Maney, Emerald Hills, both of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/632,738

(22) Filed: Aug. 4, 2000

(51) Int. Cl.[7] .......................................................... H03F 3/18
(52) U.S. Cl. ............................................. 330/264; 330/255
(58) Field of Search .................................. 330/255, 264, 330/267, 269, 273; 323/314

(56) References Cited

U.S. PATENT DOCUMENTS

| | | | |
|---|---|---|---|
| 5,311,145 | * 5/1994 | Huijsing et al. | 330/255 |
| 5,337,008 | * 8/1994 | Badyal | 330/264 |
| 5,521,553 | * 5/1996 | Butler | 330/255 |
| 6,150,883 | * 11/2000 | Ivanov | 330/255 |

* cited by examiner

*Primary Examiner*—Robert Pascal
*Assistant Examiner*—Khanh Van Nguyen
(74) *Attorney, Agent, or Firm*—Blakely, Sokoloff, Taylor & Zafman LLP

(57) ABSTRACT

Apparatus and methods to provide high supply rejection and rail-to-rail output swing at the output of an amplifier circuit. A power source supplies power to a low noise regulator and to a differential amplifier output stage. The low noise regulator supplies power to an input stage that is coupled to the output stage, and also provides a reference to the output stage for power supply noise reduction purposes. This configuration of first and second circuits give the output both full rail-to-rail swing and good supply rejection in both stages. Exemplary embodiments are disclosed.

22 Claims, 6 Drawing Sheets

METHOD AND APPARATUS FOR IMPROVING POWER SUPPLY REJECTION IN AMPLIFIER RAIL TO RAIL OUTPUT STAGES

BACKGROUND OF THE INVENTION

1. Field of the Invention

The present invention relates generally to amplifier circuits, and specifically, to high performance amplifier circuits.

2. Background Information

Operational amplifiers of various types are well known in the prior art. Such amplifiers may be characterized as having a differential input of a high impedance, a single-ended output of a low impedance and a high gain, as are generally illustrated in FIG. 1. Most present day operational amplifiers are required to operate from a single power supply voltage and have an output voltage that is capable of swinging to both supply rails. These amplifiers typically have an input stage that converts the differential input to a single-ended drive for the complementary output drivers. Such an amplifier may be seen in FIG. 2, which is representative of prior art amplifiers. In the circuit of FIG. 2, the single-ended output of the differential input stage drives the N channel output driver N1 directly, while P channel device mirrors the current of current source I1 to the P channel output driver P1. The current source I1 may be an independent current source, representative of class A operation, or as is more common in present day amplifiers, a controlled current source whose current is inversely dependent on the current in output driver N1, and hence is representative of class AB operation. Such an implementation of a class AB amplifier that is representative of prior art amplifiers is depicted in FIG. 3. In the circuit of FIG. 3, device N2 has its gate connected to the gate of device N1, and hence its drain current mirrors that of device N1. This current flows into the emitter of transistor Q2 and sets the base-emitter voltage of Q2 accordingly. Since the sum of the base-emitter voltages of transistors Q1 and Q2 is set by the independent current source, $I_{ref}$, flowing through transistors Q3 and Q4, and is therefore constant, the base-emitter voltage of transistor Q1, and hence its collector current, will decrease as the current in device N2 and transistor Q2 increases, thus fulfilling the requirements for class AB operation.

Furthermore, there are many circuit applications that require analog outputs that are minimally degraded by noise on the power supplies. Examples of these applications include high quality signal processing, signal conditioning, laptop/notebook computers, cell phones and portable headphone speaker drivers. These applications require amplifiers that exist on the same printed circuit board (PCB) with other high speed/high power circuitry and, often, very noisy switch-mode power supplies. These high speed/high power circuits tend to corrupt the power supply voltage, resulting in poor circuit performance. A highly regulated power supply may reduce the effect of noise, but the headroom voltage which is demanded by the regulator is lost for the amplifier and therefore, the output only has a rail-to-rail swing less the headroom loss in the regulator.

Traditionally, an amplifier can either have a good drive capability, i.e., a full rail-to-rail swing but a poor supply rejection or a good supply rejection but poor drive capability. Therefore, there is a need to have an amplifier circuit that has good supply rejection and full rail-to-rail output range without incurring hardware complexity.

SUMMARY OF THE INVENTION

The present invention comprises apparatus and methods to provide high supply rejection and rail-to-rail output swing at the output of an amplifier circuit. A power source supplies power to a low noise regulator and to a differential amplifier output stage. The low noise regulator supplies power to an input stage that is coupled to the output stage, and also provides a reference to the output stage for power supply noise reduction purposes. This configuration of first and second circuits give the output both full rail-to-rail swing and good supply rejection in both stages. Exemplary embodiments are disclosed.

BRIEF DESCRIPTION OF THE DRAWINGS

The features and advantages of the present invention will become apparent from the following detailed description of the present invention in which.

DETAILED DESCRIPTION

Figure 4:
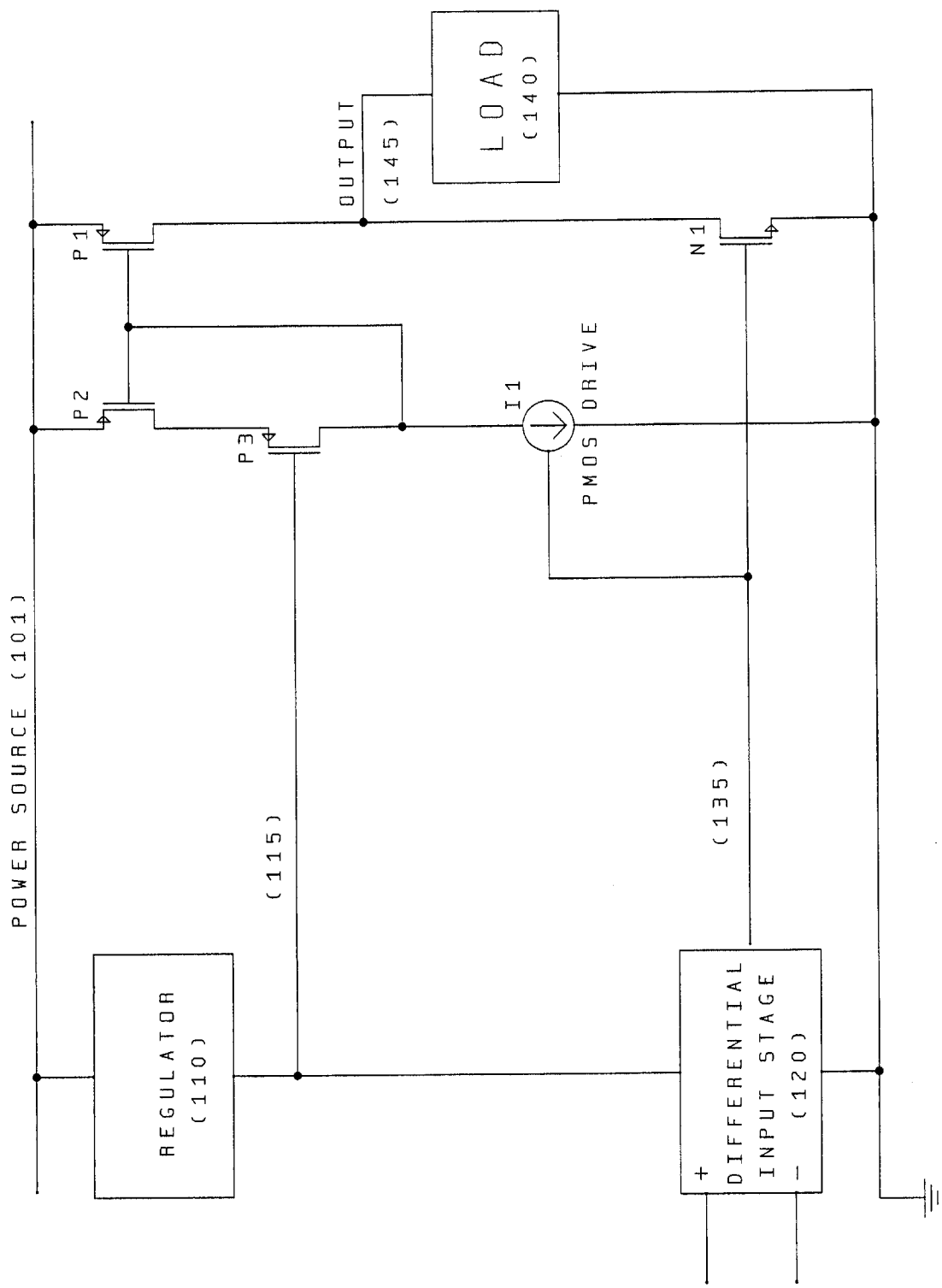
FIG. 4 is a circuit diagram illustrating one embodiment of the present invention.

FIG. 4 is a diagram illustrating a system incorporating one embodiment of the present invention. The system includes a power source 101, a regulator 110, an input stage 120, a high performance output stage in accordance with the present invention and a load device 140. The high performance output stage of this exemplary embodiment comprises transistors P1, P2, P3 and N1 and current source I1. The power source 101 provides unregulated or relatively noisy regulated power to the regulator 110 and to the high performance output stage. The regulator 110 generates a second, lower voltage supply characterized by a low supply noise. The output of the regulator 110 powers the input stage 120 and is used by the high performance output stage as a reference. The input stage 120 receives a differential input and generates a single-ended output 135. The high performance output stage receives the single-ended output 135 to generate an output 145 to drive the load device 140. The input stage 120 has a good supply rejection since it is powered by the output of the low noise regulator 110. The high performance output stage is powered by the power source 101 to provide the output 145 with a full rail-to-rail swing. The high performance output stage also achieves good supply rejection since it is referenced to the output of the regulator 110, as described in detail herein.

In the high performance output stage depicted in the exemplary embodiment of FIG. 4, the current source I1 is controlled by the output voltage 135 of the input stage 120. The current of current source I1 flows through device P3 and device P2, which forms a current mirror with the output pull-up device P1 by way of a common gate-source connection. Device P3 forms a cascode with device P2, with the gate of device P3 connected to the regulated supply, 115. Alternatively, current source I1 could be an independent current source should class A operation be desired.

Figure 1:
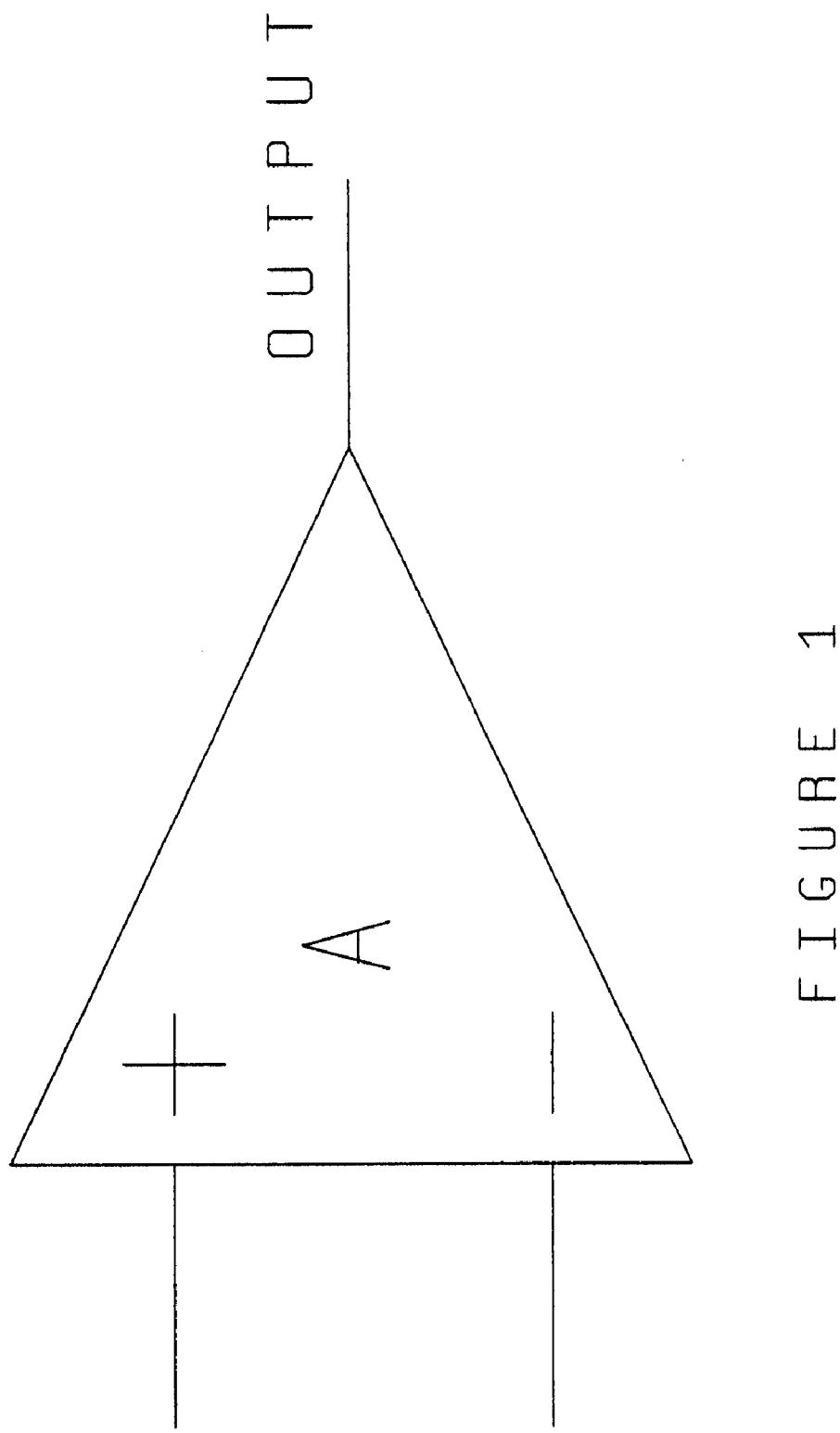
FIG. 1 illustrates the typical circuit symbol for an operational amplifier.
Figure 2:
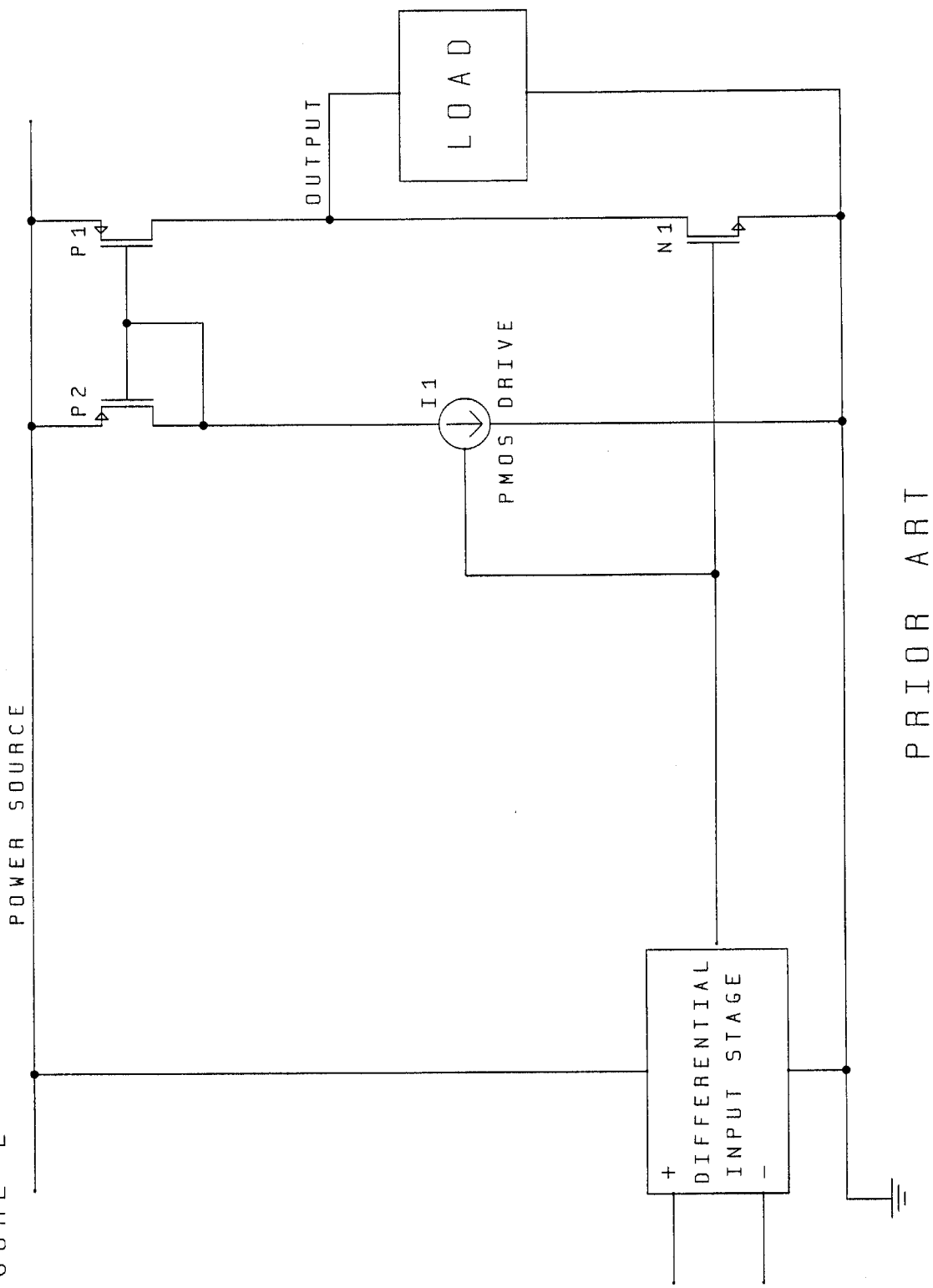
FIG. 2 is a circuit diagram representative of a prior art operational amplifier.

First consider the response of the prior art output stage of FIG. 2 to a noise voltage on the power supply 101, with the amplifier placed in a unity gain feedback configuration and having some fixed ground-referred input voltage. The noise voltage will appear at the common gate of devices P1 and P2 as required to maintain their drain currents. Hence, the diode-connected device P2 has a fixed drain-source voltage, whereas the drain-source voltage of P1 is varying by the amount of the noise voltage on the supply, since the output voltage of the amplifier is fixed by the input voltage. This results in a change in the drain current of P1 by the Early effect, and must be compensated by a change in the input voltage of the amplifier, via the feedback loop.

In FIG. 4, the cascode device P3 fixes the drain voltage of device P2 with respect to the regulated voltage 115, which is substantially free of the power supply noise. Hence, the drain voltage of P2 is isolated from the power supply noise voltage that is coupled to the common gate of devices P1 and P2. In this way, the drain-source voltage variation in device P1 arising from the power supply noise voltage, is matched by an equal drain-source voltage variation in device P2. Hence, the drain current error due to the Early effect is substantially reduced, resulting in an improvement in supply noise rejection equal to either the voltage gain of device P3 or the supply noise rejection of the regulator 110, whichever is smaller. This improvement may be 20 dB or more when compared with the situation where P2 is diode-connected and only the input stage, 120, is regulated.

Figure 3:
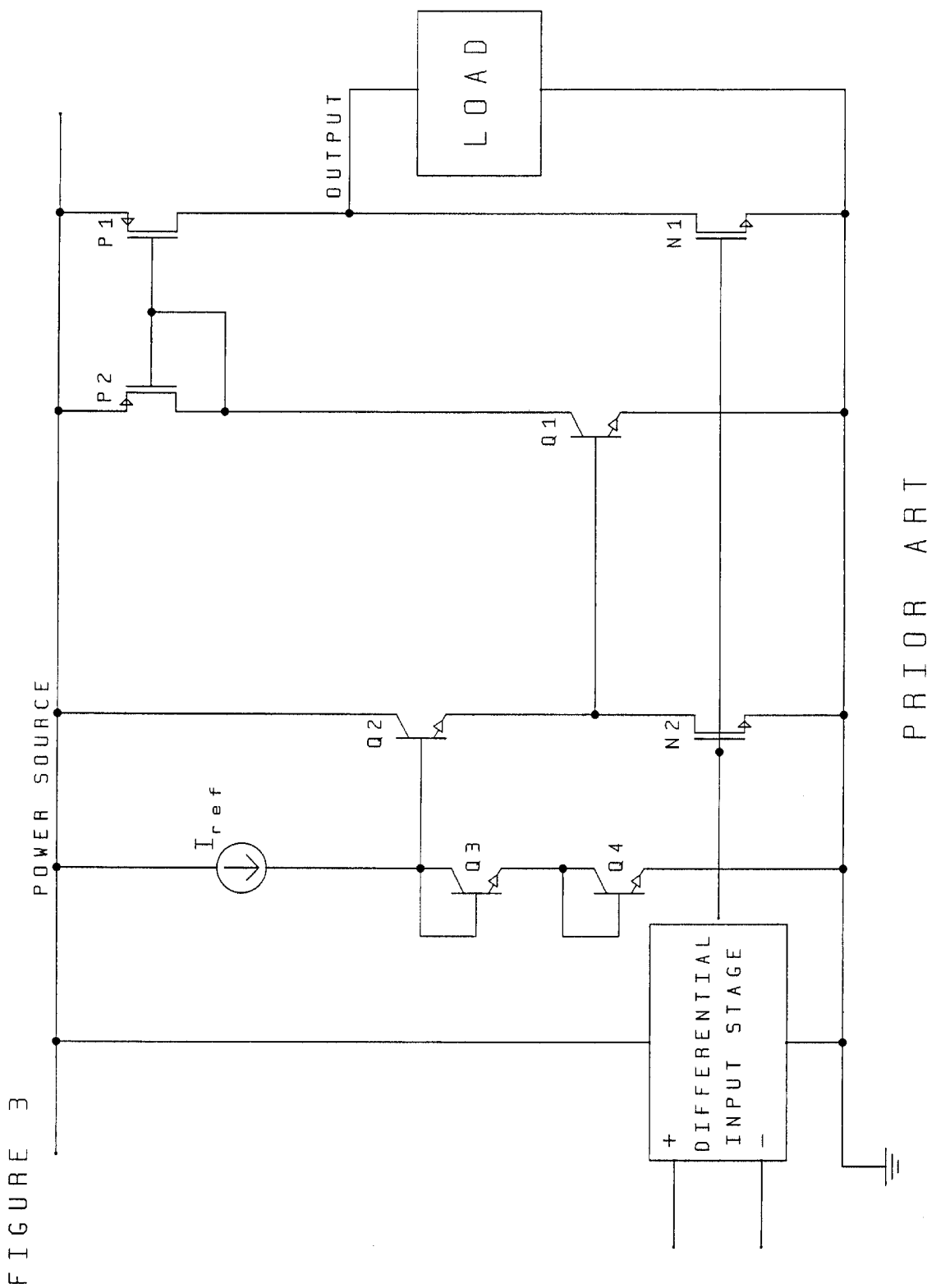
FIG. 3 is a circuit diagram representative of prior art class AB type operational amplifiers.
Figure 5:
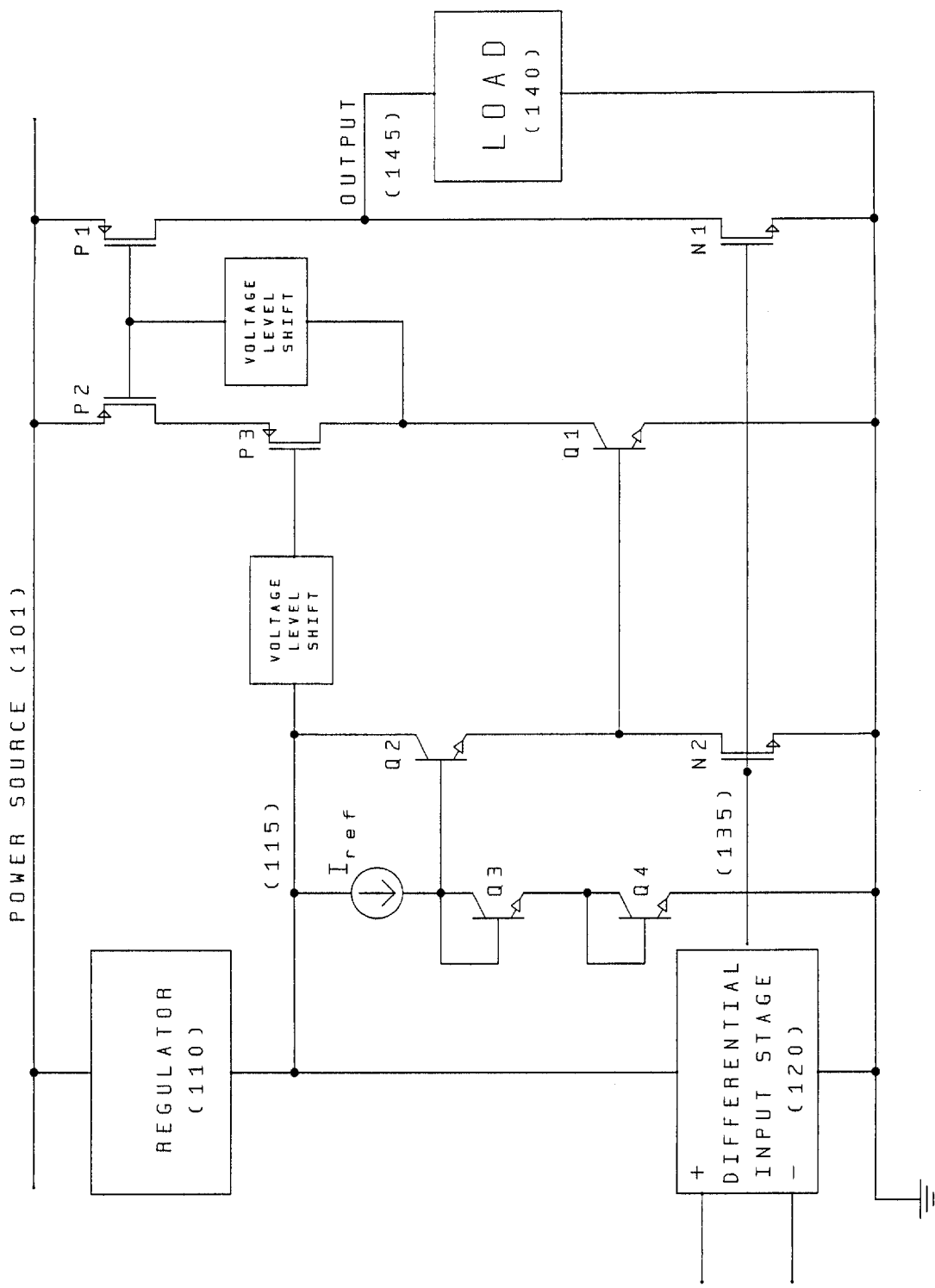
FIG. 5 is a circuit diagram illustrating another embodiment of the present invention.

A more detailed embodiment of the present invention is presented in FIG. 5. By way of example, a circuit includes transistors Q1, Q2, Q3, Q4 and independent current source $I_{ref}$ are a specific implementation of the controlled current source I1 of FIG. 4, and is representative of prior art techniques for generating a class AB current source as described with respect to the prior art amplifier of FIG. 3. This circuit is commonly referred to as VBE multiplier. While transistor Q1 functions as the variable current source of FIG. 4, and its collector voltage variation with power supply noise together with the Early effect in the transistor makes the current of the current source vary with power supply noise, this effect is secondary and does not significantly detract from the supply noise rejection achieved by the present invention. This is particularly the case since, in many embodiments of the present invention, the output driver P1 would be sized much larger than device P2 to achieve some significant current gain and hence an increased power efficiency when driving a given load.

Furthermore, the voltage level shift circuits between the common gate of devices P1 and P2 and the drain of P3, and between the regulated supply voltage 115 and the gate of device P3, are added to illustrate a practical way to allow freedom to practice the invention over a wide range of static and dynamic bias conditions as may be experienced in any typical class AB type output stage. This is achieved without loss of the essential functionality of the invention as previously described.

Most circuits are designed for a specific supply voltage that can vary by at least 10%. By way of example, in one embodiment, the circuit is designed to operate on a supply having a voltage range of 5±0.5 volts. In other words, the supply 101 is able to vary by a total of 1 volt. Likewise, referring to FIG. 4, the common gate voltage of devices P1/P2 must also be allowed to vary by 1 volt, as the gate-source voltages of devices P1 and P2 will remain substantially constant according to the value of the current source I1. However, this voltage must be sufficient to maintain devices P2 and P3 in their saturation regions under all conditions, especially since P3 has, by design, a fixed source voltage substantially independent of the 1 volt supply voltage variation. A voltage level shift between the common gate of devices P1/P2 and the drain of device P3 can satisfy this requirement. Furthermore, the regulator 110 may be required to be a low dropout type design such that the regulated supply voltage 115 is less than the saturation voltage of device P2 plus the gate-source voltage of device P3 below the supply voltage 101. In this case, a voltage level shift between the regulated supply voltage 115 and the gate of device P3 can satisfy any such requirement.

Figure 6:
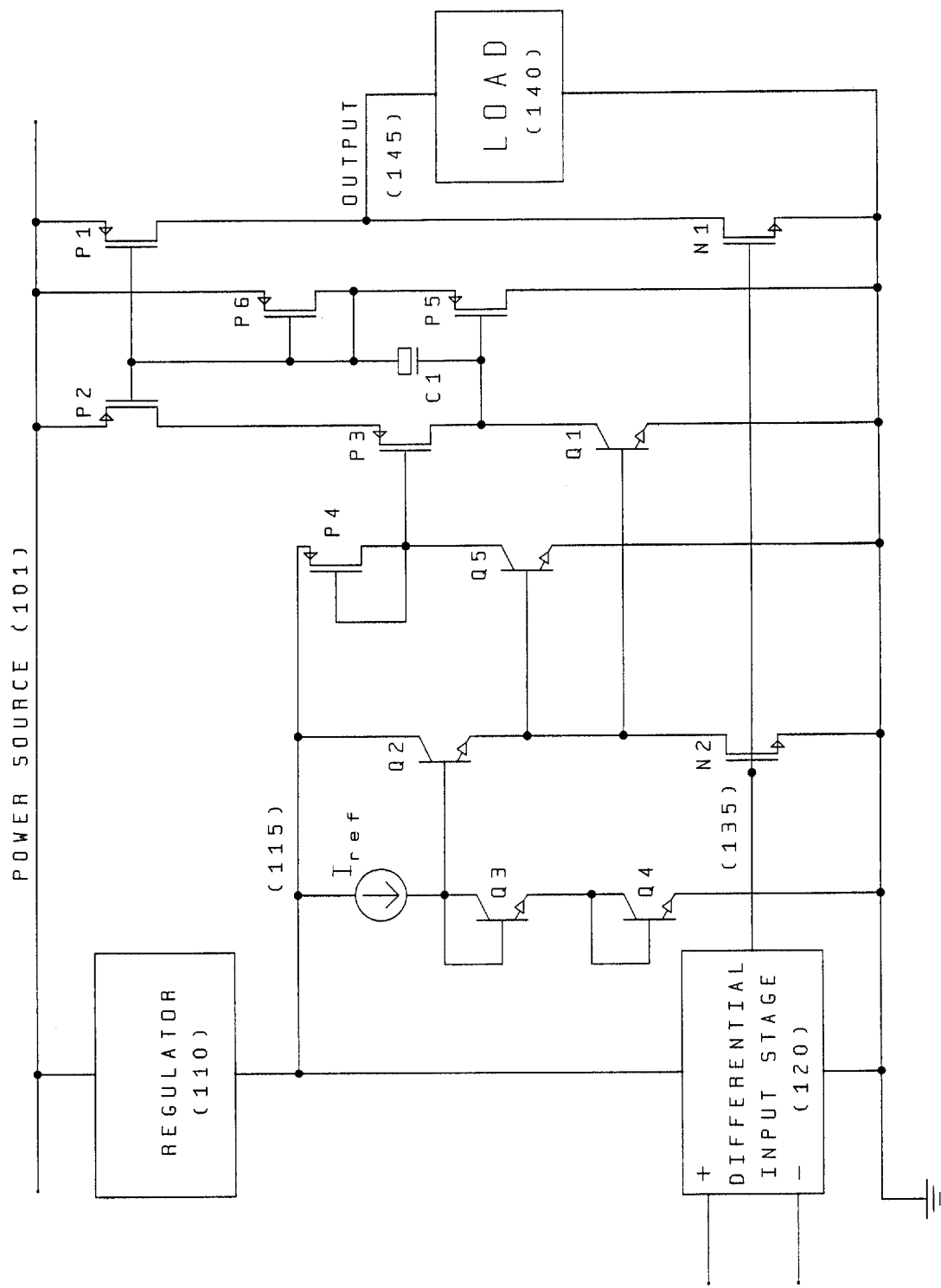
FIG. 6 is a more detailed circuit diagram for the embodiment of FIG. 5 of the present invention.

A further detailed embodiment of the invention is illustrated in FIG. 6. The circuit shows exemplary embodiments of the voltage level shift circuits used to allow (1) the regulator 110 to be of a low dropout type, and (2), a substantial (e.g. 10%) static variation in the value of the power supply voltage 101. Diode-connected device P4 provides a voltage level shift to allow the regulator output voltage 115 to be within a saturation voltage of the supply voltage 101. In addition, device Q5 has its base connected to the base of device Q1 such that current supplied to device P4 tracks the drain current of device P3, and hence their gate-source voltages track also. Device P5 provides a voltage level shift from the common gate of devices P1/P2 to the drain of device P3 equal to the gate-source voltage of device P5. This ensures that devices P2 and P3 remain in saturation for a wide range of static supply voltage values as described with respect to FIG. 5. In addition, diode-connected device P6 ensures that the current flowing through device P5 tracks the current in the current mirror devices P1 and P2 so as to improve the tracking of bias conditions in the output stage as the class AB current varies. Capacitor C1 provides high frequency compensation of the feedback loop formed by transistors P2, P3, P5 and P6. The response of the circuit of FIG. 6 to power supply noise is the same as described with respect to FIG. 4.

In summary, the high performance output stage has achieved a high supply rejection and a full rail-to-rail output swing. The high supply rejection is achieved because the output is referenced to the second, well regulated supply 115. The full rail-to-rail output swing is achieved because the output stage is powered by the first supply 101, so that no headroom is lost in the output stage to the regulator. The entire amplifier circuit including the regulator may be realized in a single integrated circuit or the regulator may be a separate, low noise power supply, derived from or separate from the first power supply.

The high performance amplifier circuit can be used, by way of example, as a speaker driver amplifier and/or a microphone signal amplifier. The high performance amplifier circuit may perform the usual functions of an amplifier circuit, such as that of a voltage and power gain amplifier. In one exemplary embodiment, the high performance amplifier circuit is used as a class AB driver amplifier having a capability of driving a 16 ohm headphone speaker from a single noisy 5 volt (±10%) supply 101, with a 5 ma quiescent supply current. The high performance amplifier circuit provides a high supply rejection while still generating a full rail-to-rail output. The high supply rejection provides a good quality output that is robust in the presence of noise or other fluctuations in supply 101. The full rail-to-rail and high supply rejection output provides the maximum load driving capability without using expensive components and/or complex hardware. While specific embodiments of the present invention using MOS transistors for the output stage have been disclosed and described in detail herein, it will be obvious to those skilled in the art that various changes in form and detail may be made therein without departing from the spirit and scope thereof.

What is claimed is:

1. An amplifier comprising:

an output stage for connection to a first power supply;

an input stage for connection to a second power supply;

the output stage having first, second, third and fourth, transistors, each having first and second electrodes and a control electrode, the voltage between the control electrode and the first electrode controlling the current flow between the first and second electrodes, the fourth transistor being of a conductivity type complimentary to the conductivity type of the first, second and third transistors;

the first and second transistors having their first electrodes coupled to the first power supply and their control electrodes coupled together, the second electrode of the second transistor being coupled to an amplifier output and to the second electrode of the fourth transistor, the first electrode of the fourth transistor being coupled to a power supply common connection and the control electrode of the fourth transistor being coupled to the input stage;

the third transistor having its first electrode coupled to the second electrode of the first transistor, its control electrode coupled to the second power supply and its second electrode coupled to the common node coupling the control electrodes of the first and second transistors and to the input stage.

2. The amplifier of claim 1 wherein the second electrode of the third transistor is coupled to the input stage through a variable current source controlled by the input stage.

3. The amplifier of claim 1 further comprised of fifth and sixth transistors of the same conductivity type as the first, second and third transistors, each having first and second electrodes and a control electrode, the voltage between the control electrode and the first electrode controlling the current flow between the first and second electrodes, the fifth transistor having its first electrode coupled to the first power supply and its control electrode and its second electrode coupled to the common node coupling the control electrodes of the first and second transistors, the third transistor having its second electrode coupled to the common coupling of the control electrodes of the first and second transistors through the control electrode and the first electrode of the sixth transistor, the sixth transistor having its second electrode coupled to the power supply common connection.

4. The amplifier of claim 3 further comprised of a capacitor coupled between the control electrode and the first electrode of the sixth transistor.

5. The amplifier of claim 4 wherein the first through sixth transistors are MOS transistors.

6. The amplifier of claim 5 wherein the first through third and the fifth and sixth transistors are p-channel transistors and the fourth transistor is an n-channel transistor.

7. The amplifier of claim 1 wherein the third transistor has its control electrode coupled to the second power supply through a voltage level shift circuit.

8. The amplifier of claim 7 wherein the voltage level shift circuit is also responsive to an output of the input stage.

9. The amplifier of claim 1 further comprising a regulator coupled to the first power supply, an output of the regulator providing the second power supply.

10. The amplifier of claim 9 wherein the amplifier and regulator comprise a single integrated circuit.

11. The amplifier of claim 1 wherein the drain of the third transistor is coupled to the input stage through a variable current source controlled by the input stage.

12. The amplifier of claim 1 wherein the amplifier is a class AB amplifier.

13. An amplifier comprising:

an output stage for connection to a first power supply;

an input stage for connection to a second power supply;

the output stage having first, second, third and fourth MOS transistors, each having a source, a drain and a gate, the fourth transistor being of a conductivity type complimentary to the conductivity type of the first, second, third, fifth and sixth transistors;

the first and second transistors having their sources coupled to the first power supply and their gates coupled together, the drain of the second transistor being coupled to an amplifier output and to the drain of the fourth transistor, the source of the fourth transistor being coupled to a power supply common connection and the gate of the fourth transistor being coupled to the input stage;

the fifth transistor having its source coupled to the first power supply and its gate and its drain coupled to the common node coupling the gates of the first and second transistors;

the third transistor having its source coupled to the drain of the first transistor, its gate coupled to the second power supply and its drain coupled to the gate of the sixth transistor and to the input stage, the source of the sixth transistor being coupled to the common gate coupling of the first and second transistors, the drain of the sixth transistor being coupled to the power supply common connection.

14. The amplifier of claim 13 further comprised of a capacitor coupled between the gate and the source of the sixth transistor.

15. The amplifier of claim 14 wherein the first through third and the fifth and sixth transistors are p-channel transistors and the fourth transistor is an n-channel transistor.

16. The amplifier of claim 13 wherein the third transistor has its gate coupled to the second power supply through a circuit dividing down a voltage of the first power supply.

17. The amplifier of claim 16 wherein the circuit is also responsive to an output of the input stage.

18. The amplifier of claim 13 further comprising a regulator coupled to the first power supply, an output of the regulator providing the second power supply.

19. The amplifier of claim 18 wherein the amplifier and regulator comprise a single integrated circuit.

20. The amplifier of claim 13 wherein the amplifier comprises a VBE multiplier.

21. The amplifier of claim 13 wherein the amplifier is a class AB amplifier.

22. The amplifier of claim 13 wherein the drain of the third transistor is coupled to the input stage through a variable current source controlled by the input stage.

* * * * *